(12) United States Patent
Yue et al.

(10) Patent No.: US 6,483,188 B1
(45) Date of Patent: Nov. 19, 2002

(54) RF INTEGRATED CIRCUIT LAYOUT

(75) Inventors: Chik Patrick Yue, Milpitas, CA (US); Masoud Zargari, Mountain View, CA (US); David Su, Mountain View, CA (US)

(73) Assignee: Atheros Communications, Inc., Palo Alto, CA (US)

( * ) Notice: Subject to any disclaimer, the term of this patent is extended or adjusted under 35 U.S.C. 154(b) by 0 days.

(21) Appl. No.: 09/571,004

(22) Filed: May 15, 2000

(51) Int. Cl.[7] .................. H01L 27/095; H01L 23/58; H01L 29/70
(52) U.S. Cl. .................. 257/728; 257/165; 257/206; 257/401; 257/500; 257/538; 257/723; 257/724; 257/725; 257/584; 257/579; 257/578; 257/587
(58) Field of Search .................. 257/728, 725, 257/197, 57, 578, 580, 582, 586, 592, 579, 584, 315, 347, 163, 164, 165, 538, 48, 205, 401, 500, 544, 549, 206

(56) References Cited

U.S. PATENT DOCUMENTS

| | | | | |
|---|---|---|---|---|
| 5,072,193 A | * | 12/1991 | Wilson et al. | 330/66 |
| 5,488,252 A | * | 1/1996 | Johansson et al. | 257/579 |
| 5,684,326 A | * | 11/1997 | Johansson et al. | 257/582 |
| 5,907,180 A | * | 5/1999 | Johansson et al. | 257/580 |
| 5,994,755 A | * | 11/1999 | DeJong et al. | 257/500 |
| 6,194,739 B1 | * | 2/2001 | Ivanov et al. | 257/48 |
| 6,198,117 B1 | * | 3/2001 | Kohno | 257/205 |
| 6,236,071 B1 | * | 5/2001 | Finlay | 257/197 |
| 6,259,133 B1 | * | 7/2001 | Gardner et al. | 257/315 |

FOREIGN PATENT DOCUMENTS

EP        0 793 275 A2      9/1997

* cited by examiner

*Primary Examiner*—Alexander O. Williams
(74) *Attorney, Agent, or Firm*—Blakely, Sokoloff, Taylor & Zafman LLP

(57) ABSTRACT

A radio-frequency (RF) integrated circuit is described. In one embodiment, the IC comprises multiple metal layers forming multiple transistors on a non-epitaxial substrate. The transistors are step and mirror symmetric. Also, the RF signal lines are on a top metal layer above all other metal layers and the power and ground planes are on a bottom metal layer below all other metal layers. The top and bottom metal layers are separated by a shield that extends beyond the RF signal lines by a distance that is at least the same distance that the shield is away from the RF lines. Low frequency signals are on signal lines below the top metal layer.

20 Claims, 3 Drawing Sheets

(a) Step Symmetry (b) Mirror Symmetry (c) Step and Mirror Symmetry

RF INTEGRATED CIRCUIT LAYOUT

FIELD OF THE INVENTION

The field of the invention relates to fabricating integrated circuits (ICs); more particularly, the present invention relates to fabricating radio-frequency (RF) ICs.

BACKGROUND OF THE INVENTION

Communication systems employ transmitters and receivers to transfer information over some media. When communications occur over atmosphere, or air waves, they are commonly referred to as "wireless" communications. One type of wireless communication is radio-frequency (RF) communication. Today, the frequencies at which RF communication may be used has become quite high. It is not uncommon to see RF frequencies in the Gigahertz range.

Problems may arise on integrated circuit designs for RF devices. For example, the RF signals being received and transmitted may interfere with other signals on a chip. Parasitic capacitances can limit the frequency of the RF signal. Such interference increases as the frequency of the RF signals increases.

SUMMARY OF THE INVENTION

A radio-frequency (RF) integrated circuit is described. In one embodiment, the IC comprises multiple metal layers forming multiple transistors on a substrate. The transistors are step and mirror symmetric. Also, the RF signal lines are on a top metal layer above all other metal layers and the power and ground planes are on a bottom metal layer below all other metal layers. The top and bottom metal layers are separated by a shield that extends beyond the RF signal lines by a distance that is at least the same distance that the shield is away from the RF lines. Low frequency signals are on signal lines below the top metal layer.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A layout for a radio frequency (RF) device is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

The present invention provides a novel semiconductor layout for an RF device. In one embodiment, the RF device comprises an integrated circuit (IC) containing an RF front-end of a communication unit. In one embodiment, the RF IC includes multiple metal layers forming transistors on a substrate and includes a shield between the RF lines and other signal lines in the IC to prevent interference between the two.

Figure 1:
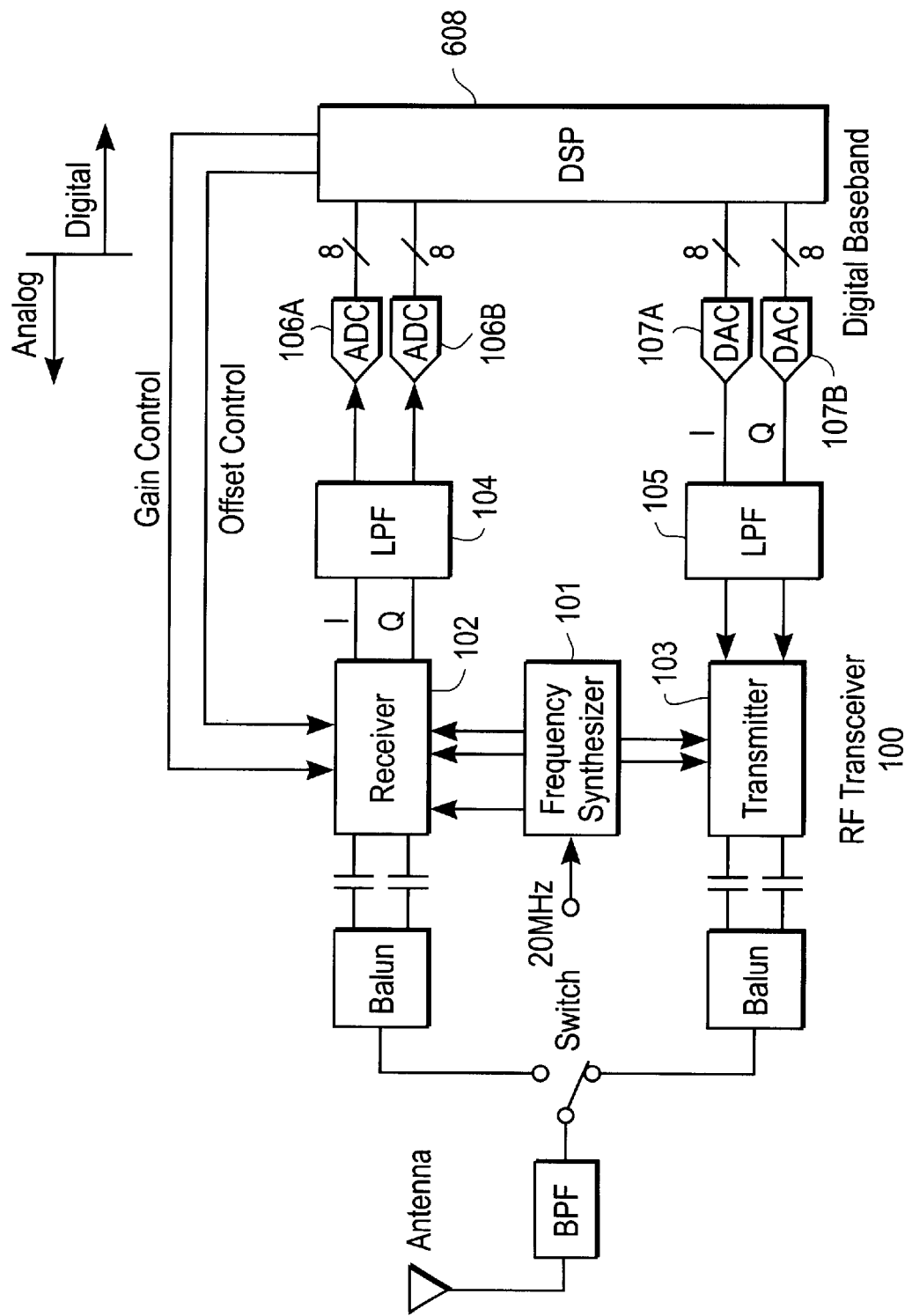
FIG. 1 is a block diagram of one embodiment of a mobile communication unit.

FIG. 1 is a block diagram of one embodiment of one such communication unit (e.g., radio). Referring to FIG. 1, the radio contains a front-end 100 having receiver 102, transmitter 103, and frequency synthesizer 101. In one embodiment, frequency synthesizer 101 supplies clock signals to receiver 102 and transmitter 103 using a 20 MHz input signal.

For more information on front-end 100, see U.S. patent application Ser. No. 09/483,948, entitled "An RF Front-End with a Multistage Stepdown Filtering Architecture," filed Jan. 13, 2000, and assigned to the corporate assignee of the present invention.

The I and Q signals of the receive path of the front-end are coupled to a low pass filter (LPF) 104, which filters signals at frequencies above a predetermined frequency (set based on the design). The filtered signals are converted to digital using analog-to-digital converters (ADCs) 106A and 106B. The digital signals are input to digital signal processor (DSP) 108.

The I and Q signals input to transmitter 103 of the transmit path of the front-end are received from LPF 105, which filters I and Q signals from digital-to-analog converters (DACs) 107A and 107B. DACs 107A and 107B receive signals from DSP 108.

DSP 108 performs the processing associated with modulation and demodulation signals. In one embodiment, DSP 108 also generates gain, power level, and offset control signals that are sent to the RF front end to control the front end. The gain and power level control signals control the gains of both receive and transmit paths as well as the transmitter power level.

Figure 2:
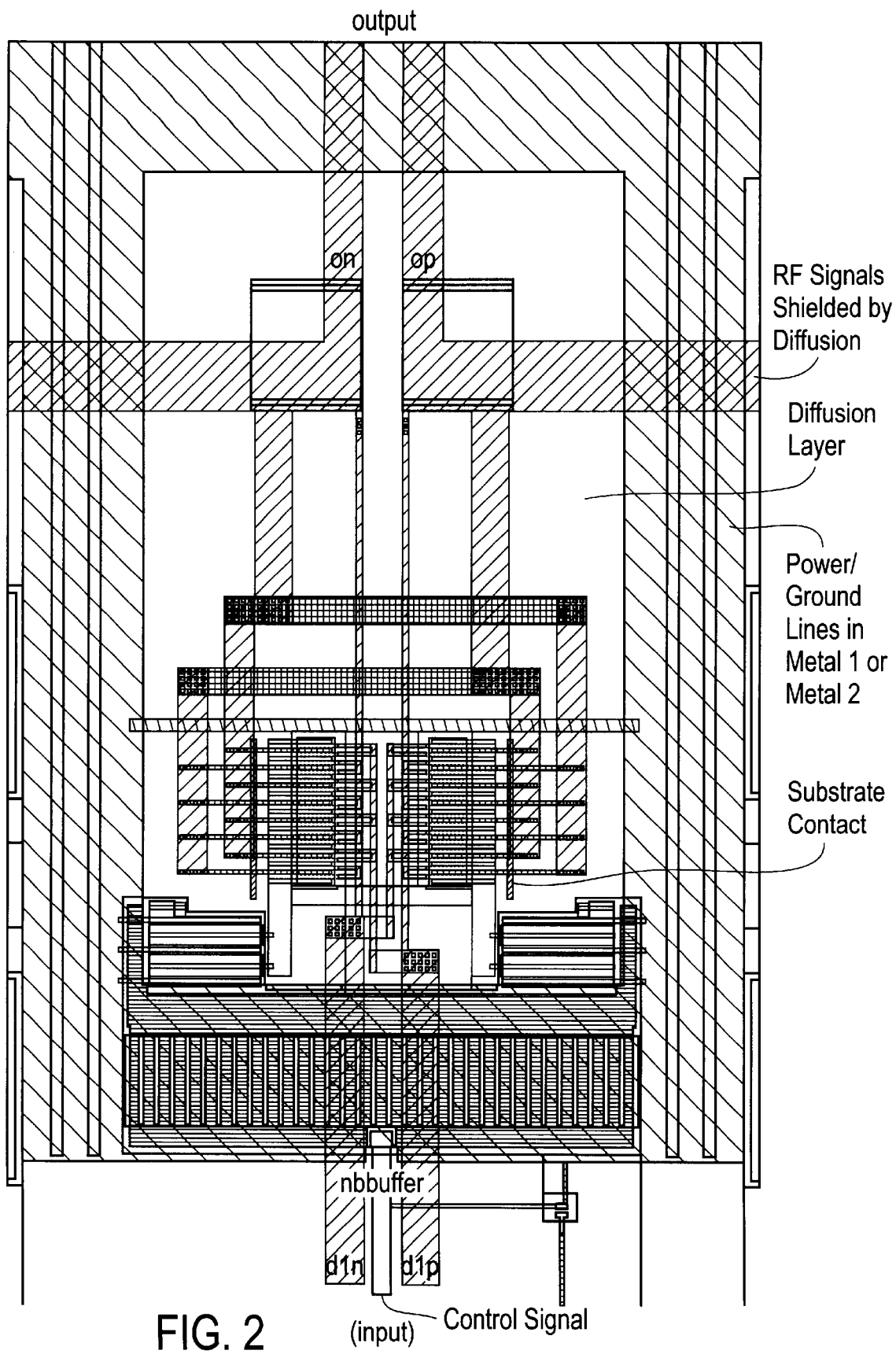
FIG. 2 illustrates a layout of one embodiment of a mobile communication unit.

In one embodiment, the layout of RF front-end 100 is designed to receive each RF signal as a differential signal in a common centroid configuration. FIG. 2 illustrates one embodiment of such a layout.

The layout uses multiple metal layers and the RF signal is received on an input signal terminal on the highest layer of metal. In one embodiment, the layout has five metal layers and the RF signal is received on metal layer 5. In one embodiment, the spacing between two lines on the highest layer of metal (e.g., metal layer 5) is greater than the distance from the metal layer to the ground plane.

The layout has a low resistance (e.g., 5 ohms/square) shield to shield the RF signal lines on the highest layer of metal from the ground plane. In one embodiment, the shield comprises a diffusion layer, polysilicon or metal layer 1. The shield extends beyond the RF signal lines by an amount of distance that the shield is away from the RF signal lines. In one embodiment, the shield extends beyond the RF lines by a fixed amount (e.g., at least 5 $\mu$m) and the amount of the extension is process dependent.

The layout has the power and ground planes in the lowest layer of metal. In one embodiment, the lowest layer of metal is the metal layer 1. In an alternative embodiment, the ground and power planes are in the metal 2 layer. By being at the lowest metal layer, the ground and power planes are below all of the high frequency signals. Because the ground plane is on the lowest level, it operates as a shield under the RF pads.

The layout has control signals in low level metal. In one embodiment, the control signals are in metal layers 1, 2 or 3. Preferably, the control signals are in metal layer 1; however, due to the power and ground paths being in metal layer 1, some of the control signals are run on metal layers 2 and 3. These control signals may include low frequency signals (e.g., digital signals), such as, for example, gain and power level control signals.

Figure 3:
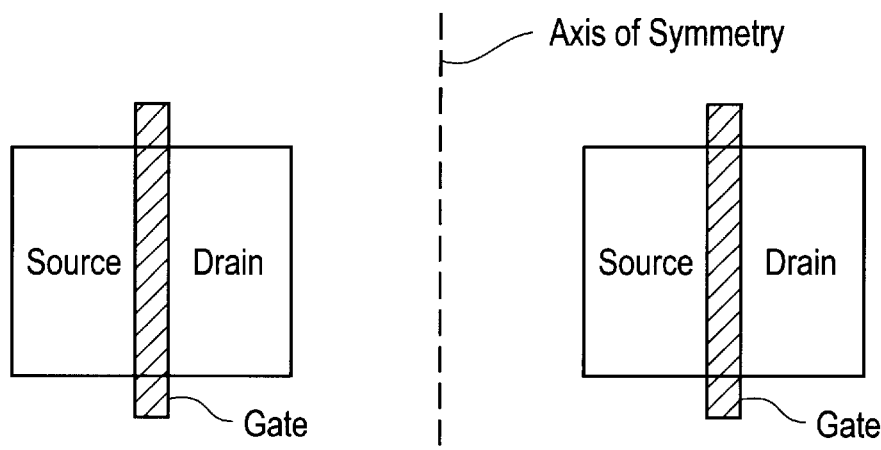
FIGS. 3A–C illustrate step symmetry, mirror symmetry, and step and mirror symmetry of transistors, respectively in a layout of a mobile communication unit.
Figure 3:
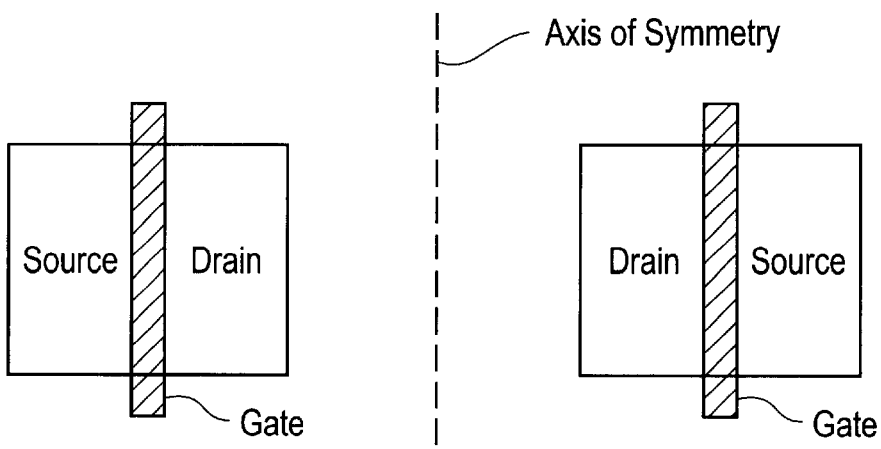
Figure 3:
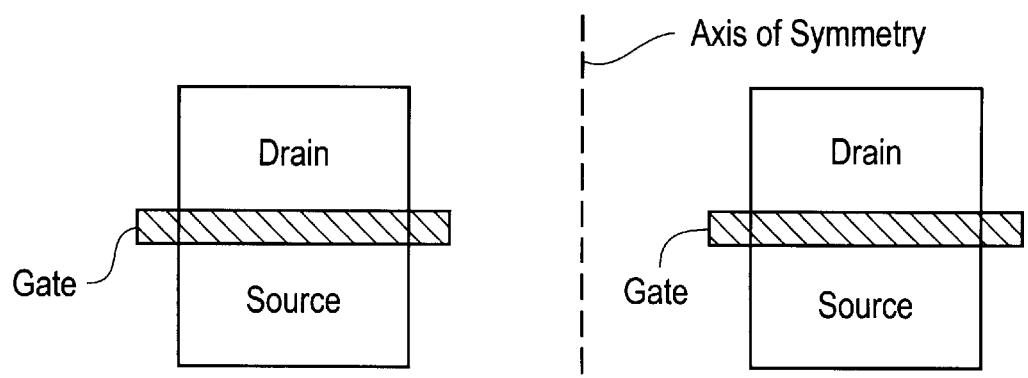

The transistors in the layout may be fabricated with step symmetry. (FIG. 3A), mirror symmetry (FIG. 3B), or step and mirror symmetry, (FIG. 3C). Referring to FIG. 3C, the gate of each transistor is perpendicular to each mirroring location and both the drain and source of each transistor are adjacent to a mirroring location.

Furthermore, the width of transistors in the layout is small. In one embodiment, the width of each transistor is approximately 5 μm. This is to reduce gate resistance and to maintain proximity to substrate contact.

In one embodiment, the substrate on which the mobile device is fabricated is a non-epitaxial substrate. The layout has the substrate contact close to the transistors. In one embodiment, they are tied to ground.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

Thus, a layout for a mobile device has been described.

We claim:

1. A radio-frequency (RF) integrated circuit comprising a plurality of metal layers and a plurality of transistors on a substrate, the plurality of transistors being step and mirror symmetric, and wherein RF signal lines are on one or more upper metal layers above all other metal layers of the plurality of metal layers and power and ground planes are on one or more lower metal layers below all other metal layers, RF signal lines in upper metal layers being shielded by a shield that extends beyond the RF signal lines by a distance that is at least the same distance that the shield is away from the RF lines, and further wherein low frequency signals are on signal lines below the top metal layer to the extent necessary to avoid RF signal lines.

2. The IC defined in claim 1 wherein the plurality of metal layers comprises at least five metal layers.

3. The IC defined in claim 1 wherein spacing between two lines on the top metal layer is greater than a distance from the top metal layer to the ground plane.

4. The IC defined in claim 1 wherein the shield comprises a diffusion layer.

5. The IC defined in claim 1 wherein the shield comprises polysilicon.

6. The IC defined in claim 1 wherein the shield comprises metal layer 1.

7. The IC defined in claim 1 wherein the shield extends beyond the RF lines by a fixed amount.

8. The IC defined in claim 7 wherein the fixed amount is process dependent.

9. The IC defined in claim 1 wherein the ground plane acts as a shield below RF pads.

10. The IC defined in claim 1 wherein the low frequency signals comprise digital signals.

11. The IC defined in claim 1 wherein transistor width is approximately 5 μm.

12. The IC defined in claim 1 wherein the substrate is a non-epitaxial substrate.

13. A radio-frequency (RF) integrated circuit comprising a plurality of metal layers and a plurality of transistors on a non-epitaxial substrate, the, plurality of transistors being step and mirror symmetric, and wherein RF signal lines are on one or more upper metal layers above all other metal layers of the plurality of metal layers and power and ground planes are on one or more lower metal layers below all other metal layers, the RF signal lines on the one or more upper metal layers being shielded by a diffusion layer that extends beyond the RF signal lines by a distance that is at least the same distance that the diffusion layer is away from the RF lines, and further wherein low frequency signals are on signal lines below the one or more upper metal layers to the extent necessary to avoid the RF lines.

14. The IC defined in claim 13 wherein the shield comprises polysilicon.

15. The IC defined in claim 13 wherein the shield comprises metal layer 1.

16. The IC defined in claim 13 wherein the shield extends beyond the RF lines by a fixed amount.

17. The IC defined in claim 16 wherein the fixed amount is process dependent.

18. The IC defined in claim 13 wherein the ground plane acts as a shield below RF pads.

19. The IC defined in claims 13 wherein the low frequency signals comprise digital signals.

20. The IC defined in claim 13 wherein transistor width is approximately 5 μm.

* * * * *